(12) United States Patent
Holscher et al.

(10) Patent No.: US 7,804,115 B2
(45) Date of Patent: Sep. 28, 2010

(54) SEMICONDUCTOR CONSTRUCTIONS HAVING ANTIREFLECTIVE PORTIONS

(75) Inventors: Richard Holscher, Boise, ID (US); Zhiping Yin, Boise, ID (US); Tom Glass, Idaho City, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/482,244

(22) Filed: Jul. 7, 2006

(65) Prior Publication Data

US 2006/0269699 A1 Nov. 30, 2006

Related U.S. Application Data

(60) Division of application No. 11/220,458, filed on Sep. 6, 2005, now abandoned, which is a continuation of application No. 10/917,820, filed on Aug. 13, 2004, now abandoned, which is a division of application No. 10/277,437, filed on Oct. 21, 2002, now abandoned, which is a division of application No. 09/885,393, filed on Jun. 19, 2001, now Pat. No. 6,878,507, which is a continuation of application No. 09/030,618, filed on Feb. 25, 1998, now Pat. No. 6,274,292.

(51) Int. Cl.
*H01L 31/062* (2006.01)
*C09K 19/00* (2006.01)

(52) U.S. Cl. ............ 257/291; 257/437; 257/639; 257/640; 257/646; 257/649; 428/1.6

(58) Field of Classification Search ............ 257/437, 257/639, 640, 646, 649; 428/1.6
See application file for complete search history.

(56) References Cited

U.S. PATENT DOCUMENTS 4,158,717 A 6/1979 Nelson (Continued)

FOREIGN PATENT DOCUMENTS

EP 0 464515 A3 1/1992

(Continued)

OTHER PUBLICATIONS

Merriam-Webster Online Dictionary www.Merriam-Webster.com.*

(Continued)

*Primary Examiner*—Bradley K Smith
*Assistant Examiner*—Jami M Valentine
(74) *Attorney, Agent, or Firm*—Wells St. John P.S.

(57) ABSTRACT

In one aspect, the invention includes a semiconductor processing method. An antireflective material layer is formed over a substrate. At least a portion of the antireflective material layer is annealed at a temperature of greater than about 400° C. A layer of photoresist is formed over the annealed antireflective material layer. The layer of photoresist is patterned. A portion of the antireflective material layer unmasked by the patterned layer of photoresist is removed. In another aspect, the invention includes the following semiconductor processing. An antireflective material layer is formed over a substrate. The antireflective material layer is annealed at a temperature of greater than about 400° C. A layer of photoresist is formed over the annealed antireflective material layer. Portions of the layer of photoresist are exposed to radiation waves. Some of the radiation waves are absorbed by the antireflective material during the exposing.

9 Claims, 2 Drawing Sheets

U.S. PATENT DOCUMENTS

| | | |
|---|---|---|
| 4,444,617 A | 4/1984 | Whitcomb |
| 4,474,975 A | 10/1984 | Clemons et al. |
| 4,523,214 A | 6/1985 | Hirose et al. |
| 4,552,783 A | 11/1985 | Stoll et al. |
| 4,562,091 A | 12/1985 | Sachdev et al. |
| 4,592,129 A * | 6/1986 | Legge .................. 438/72 |
| 4,600,671 A | 7/1986 | Saitoh et al. |
| 4,648,904 A | 3/1987 | DePasquale et al. |
| 4,695,859 A | 9/1987 | Guha et al. |
| 4,702,936 A | 10/1987 | Maeda et al. |
| 4,755,478 A | 7/1988 | Abernathey et al. |
| 4,764,247 A | 8/1988 | Leveriza et al. |
| 4,805,683 A | 2/1989 | Magdo et al. |
| 4,833,096 A | 5/1989 | Huang et al. |
| 4,863,755 A | 9/1989 | Hess et al. |
| 4,870,470 A | 9/1989 | Bass et al. |
| 4,907,064 A * | 3/1990 | Yamazaki et al. .......... 257/649 |
| 4,910,160 A | 3/1990 | Jennings et al. |
| 4,940,509 A | 7/1990 | Tso et al. |
| 4,954,867 A | 9/1990 | Hosaka |
| 4,971,655 A | 11/1990 | Stefano et al. |
| 4,992,306 A | 2/1991 | Hochberg et al. |
| 5,034,348 A | 7/1991 | Hartswick et al. |
| 5,036,383 A | 7/1991 | Mori |
| 5,061,509 A | 10/1991 | Naito et al. |
| 5,140,390 A | 8/1992 | Li et al. |
| 5,219,613 A | 6/1993 | Fabry et al. |
| 5,234,869 A | 8/1993 | Mikata et al. |
| 5,244,537 A | 9/1993 | Ohnstein |
| 5,258,608 A | 11/1993 | Uchiya |
| 5,260,600 A | 11/1993 | Harada |
| 5,270,267 A | 12/1993 | Ouellet |
| 5,276,347 A | 1/1994 | Wei et al. |
| 5,285,017 A | 2/1994 | Gardner |
| 5,286,661 A | 2/1994 | deFresart et al. |
| 5,302,366 A | 4/1994 | Schuette et al. |
| 5,312,768 A | 5/1994 | Gonzalez |
| 5,314,724 A | 5/1994 | Tsukune et al. |
| 5,340,621 A | 8/1994 | Matsumoto et al. |
| 5,356,515 A | 10/1994 | Tahara et al. |
| 5,376,591 A | 12/1994 | Maeda et al. |
| 5,405,489 A | 4/1995 | Kim et al. |
| 5,413,963 A | 5/1995 | Yen et al. |
| 5,429,987 A | 7/1995 | Allen |
| 5,439,838 A | 8/1995 | Yang |
| 5,441,797 A | 8/1995 | Hogan |
| 5,461,003 A | 10/1995 | Havemann et al. |
| 5,470,772 A | 11/1995 | Woo |
| 5,472,827 A | 12/1995 | Ogawa et al. |
| 5,472,829 A | 12/1995 | Ogawa |
| 5,482,894 A | 1/1996 | Havemann |
| 5,498,555 A | 3/1996 | Lin |
| 5,536,857 A | 7/1996 | Narula et al. |
| 5,541,445 A | 7/1996 | Quellet |
| 5,543,654 A | 8/1996 | Dennen |
| 5,550,008 A | 8/1996 | Tomo et al. |
| 5,554,567 A | 9/1996 | Wang |
| 5,591,494 A | 1/1997 | Sato et al. |
| 5,591,566 A | 1/1997 | Ogawa |
| 5,593,741 A | 1/1997 | Ikeda |
| 5,600,165 A | 2/1997 | Tsukamoto et al. |
| 5,639,687 A | 6/1997 | Roman et al. |
| 5,641,607 A | 6/1997 | Ogawa et al. |
| 5,648,202 A | 7/1997 | Ogawa et al. |
| 5,652,187 A | 7/1997 | Kim et al. |
| 5,656,330 A | 8/1997 | Niiyama et al. |
| 5,656,337 A | 8/1997 | Park et al. |
| 5,661,093 A | 8/1997 | Ravi et al. |
| 5,667,015 A | 9/1997 | Harestad et al. |
| 5,670,297 A | 9/1997 | Ogawa et al. |
| 5,674,356 A * | 10/1997 | Nagayama .................. 438/694 |
| 5,677,015 A | 10/1997 | Hasegawa |
| 5,677,111 A | 10/1997 | Ogawa et al. |
| 5,691,212 A | 11/1997 | Tsai et al. |
| 5,698,352 A | 12/1997 | Ogawa et al. |
| 5,709,741 A | 1/1998 | Akamatsu et al. |
| 5,710,067 A | 1/1998 | Foote et al. |
| 5,711,987 A | 1/1998 | Bearinger et al. |
| 5,731,242 A | 3/1998 | Parat et al. |
| 5,741,721 A | 4/1998 | Stevens |
| 5,744,399 A | 4/1998 | Rostoker et al. |
| 5,747,388 A | 5/1998 | Küsters et al. |
| 5,750,442 A | 5/1998 | Juengling |
| 5,753,320 A | 5/1998 | Mikoshiba et al. |
| 5,759,746 A | 6/1998 | Azuma et al. |
| 5,759,755 A | 6/1998 | Park et al. |
| 5,783,493 A | 7/1998 | Yeh et al. |
| 5,786,039 A | 7/1998 | Brouquet |
| 5,789,819 A | 8/1998 | Gnade et al. |
| 5,792,689 A | 8/1998 | Yang et al. |
| 5,796,151 A | 8/1998 | Hsu et al. |
| 5,800,877 A | 9/1998 | Maeda et al. |
| 5,801,399 A | 9/1998 | Hattori et al. |
| 5,807,660 A | 9/1998 | Lin et al. |
| 5,817,549 A | 10/1998 | Yamazaki et al. |
| 5,831,321 A | 11/1998 | Nagayama |
| 5,838,052 A | 11/1998 | McTeer |
| 5,840,610 A | 11/1998 | Gilmer et al. |
| 5,858,880 A | 1/1999 | Dobson et al. |
| 5,872,035 A | 2/1999 | Kim et al. |
| 5,872,385 A | 2/1999 | Taft et al. |
| 5,874,367 A | 2/1999 | Dobson |
| 5,883,011 A | 3/1999 | Lin et al. |
| 5,883,014 A | 3/1999 | Chen et al. |
| 5,933,721 A | 8/1999 | Hause et al. |
| 5,948,482 A | 9/1999 | Brinker et al. |
| 5,960,289 A | 9/1999 | Tsui et al. |
| 5,962,581 A | 10/1999 | Hayase et al. |
| 5,968,324 A * | 10/1999 | Cheung et al. ......... 204/192.28 |
| 5,968,611 A | 10/1999 | Kaloyeros et al. |
| 5,981,368 A | 11/1999 | Gardner et al. |
| 5,985,519 A | 11/1999 | Kakamu et al. |
| 5,986,318 A | 11/1999 | Kim et al. |
| 5,994,217 A | 11/1999 | Ng |
| 5,994,730 A | 11/1999 | Shrivastava et al. |
| 6,001,741 A | 12/1999 | Alers |
| 6,001,747 A | 12/1999 | Annapragada |
| 6,004,850 A | 12/1999 | Lucas et al. |
| 6,005,277 A | 12/1999 | Liu et al. |
| 6,008,121 A | 12/1999 | Yang et al. |
| 6,008,124 A | 12/1999 | Sekiguchi et al. |
| 6,017,614 A | 1/2000 | Tsai et al. |
| 6,017,779 A | 1/2000 | Miyasaka |
| 6,020,243 A | 2/2000 | Wallace et al. |
| 6,022,404 A | 2/2000 | Ettlinger et al. |
| 6,028,015 A | 2/2000 | Wang et al. |
| 6,030,901 A | 2/2000 | Hopper et al. |
| 6,037,228 A | 3/2000 | Hsu |
| 6,040,619 A | 3/2000 | Wang et al. |
| 6,054,379 A | 4/2000 | Yau et al. |
| 6,057,217 A | 5/2000 | Uwasawa |
| 6,057,587 A | 5/2000 | Ghandehari et al. |
| 6,060,765 A | 5/2000 | Maeda |
| 6,060,766 A | 5/2000 | Mehta et al. |
| 6,071,799 A | 6/2000 | Park et al. |
| 6,072,227 A | 6/2000 | Yau et al. |
| 6,080,529 A | 6/2000 | Ye et al. |
| 6,083,852 A | 7/2000 | Cheung et al. |
| 6,087,064 A | 7/2000 | Lin et al. |
| 6,087,267 A | 7/2000 | Dockrey et al. |
| 6,096,656 A | 8/2000 | Matzke et al. |
| 6,114,255 A | 9/2000 | Juengling |
| 6,114,736 A | 9/2000 | Balasubramanyam et al. |
| 6,118,163 A | 9/2000 | Gardner et al. |

| | | | | | |
|---|---|---|---|---|---|
| 6,121,133 A | 9/2000 | Iyer et al. | 2001/0019868 A1 | 9/2001 | Gonzalez et al. |
| 6,124,641 A | 9/2000 | Matsuura | 2002/0033486 A1 | 3/2002 | Kim et al. |
| 6,130,168 A | 10/2000 | Chu et al. | 2002/0055275 A1 | 5/2002 | MacNeil |
| 6,133,096 A | 10/2000 | Su et al. | 2002/0081834 A1 | 6/2002 | Daniels et al. |
| 6,133,613 A | 10/2000 | Yao et al. | 2002/0098684 A1 | 7/2002 | Li et al. |
| 6,133,618 A * | 10/2000 | Steiner ............... 257/646 | 2003/0013311 A1 | 1/2003 | Chang et al. |
| 6,136,636 A | 10/2000 | Wu | 2003/0077916 A1 | 4/2003 | Xu et al. |
| 6,140,151 A | 10/2000 | Akram | 2003/0173671 A1 | 9/2003 | Hironaga et al. |
| 6,140,677 A | 10/2000 | Gardner et al. | 2003/0201465 A1 | 10/2003 | Ryuzaki et al. |
| 6,143,670 A | 11/2000 | Cheng et al. | 2003/0207594 A1 | 11/2003 | Catabay et al. |
| 6,153,504 A | 11/2000 | Shields et al. | 2003/0235979 A1 | 12/2003 | Yuasa |
| 6,156,485 A | 12/2000 | Tang et al. | 2004/0053459 A1 | 3/2004 | MacNeil |
| 6,156,674 A | 12/2000 | Li et al. | 2004/0071878 A1 | 4/2004 | Schuhmacher et al. |
| 6,159,804 A | 12/2000 | Gardner et al. | 2004/0175933 A1 | 9/2004 | Shishida et al. |
| 6,159,871 A | 12/2000 | Loboda et al. | 2005/0023691 A1 | 2/2005 | Watanabe et al. |
| 6,184,151 B1 | 2/2001 | Adair et al. | 2005/0064608 A1 | 3/2005 | Chang et al. |
| 6,184,158 B1 | 2/2001 | Shufflebotham et al. | 2005/0191828 A1 | 9/2005 | Al-Bayati et al. |
| 6,187,657 B1 | 2/2001 | Xiang et al. | 2007/0098890 A1 | 5/2007 | Sasaki et al. |
| 6,187,694 B1 | 2/2001 | Cheng et al. | | | |
| 6,198,144 B1 | 3/2001 | Pan et al. | | | |
| 6,200,835 B1 | 3/2001 | Manning | | | |

FOREIGN PATENT DOCUMENTS

| | | |
|---|---|---|
| EP | 0 771886 A1 | 5/1997 |
| EP | 0 942330 A1 | 9/1999 |
| GB | 593727 | 10/1947 |
| JP | 63-157443 | 6/1988 |
| JP | 63316476 | 12/1988 |
| JP | 06-196400 | 7/1994 |
| JP | 6232113 | 8/1994 |
| JP | 6-244172 | 9/1994 |
| JP | 7201716 | 8/1995 |
| JP | 08-045926 | 2/1996 |
| JP | 8046186 | 2/1996 |
| JP | 8046188 | 2/1996 |
| JP | 8051058 | 2/1996 |
| JP | 8078322 | 3/1996 |
| JP | 10-163083 | 6/1998 |

| | | |
|---|---|---|
| 6,200,863 B1 | 3/2001 | Xiang et al. |
| 6,204,168 B1 | 3/2001 | Naik et al. |
| 6,208,004 B1 | 3/2001 | Cunningham |
| 6,209,484 B1 | 4/2001 | Huang et al. |
| 6,218,292 B1 | 4/2001 | Foote |
| 6,225,217 B1 | 5/2001 | Usami et al. |
| 6,235,568 B1 | 5/2001 | Murthy et al. |
| 6,235,591 B1 | 5/2001 | Balasubramanian et al. |
| 6,238,976 B1 | 5/2001 | Noble et al. |
| 6,268,282 B1 | 7/2001 | Sandhu et al. |
| 6,274,292 B1 | 8/2001 | Holscher et al. |
| 6,281,100 B1 | 8/2001 | Yin et al. |
| 6,284,677 B1 | 9/2001 | Hsiao et al. |
| 6,323,101 B1 | 11/2001 | Li et al. |
| 6,331,493 B1 | 12/2001 | Sharan |
| 6,348,407 B1 | 2/2002 | Gupta et al. |
| 6,373,114 B1 | 4/2002 | Jeng et al. |
| 6,383,951 B1 | 5/2002 | Li |
| 6,403,464 B1 | 6/2002 | Chang |
| 6,429,115 B1 | 8/2002 | Tsai et al. |
| 6,432,791 B1 | 8/2002 | Hutter et al. |
| 6,435,943 B1 | 8/2002 | Chang et al. |
| 6,436,808 B1 | 8/2002 | Ngo et al. |
| 6,440,860 B1 | 8/2002 | DeBoer et al. |
| 6,444,593 B1 | 9/2002 | Ngo et al. |
| 6,451,504 B2 | 9/2002 | Rolfson et al. |
| 6,465,372 B1 | 10/2002 | Xia et al. |
| 6,486,057 B1 | 11/2002 | Yeh et al. |
| 6,486,061 B1 | 11/2002 | Xia et al. |
| 6,486,074 B1 | 11/2002 | Rolfson et al. |
| 6,492,688 B1 | 12/2002 | Ilg |
| 6,498,084 B2 | 12/2002 | Bergemont |
| 6,503,818 B1 | 1/2003 | Jang |
| 6,518,122 B1 | 2/2003 | Chan et al. |
| 6,528,432 B1 | 3/2003 | Ngo et al. |
| 6,589,890 B2 | 7/2003 | Cohen et al. |
| 6,627,532 B1 | 9/2003 | Gaillard et al. |
| 6,627,535 B2 | 9/2003 | MacNeil et al. |
| 6,632,478 B2 | 10/2003 | Gaillard et al. |
| 6,632,712 B1 | 10/2003 | Ang et al. |
| 6,638,875 B2 | 10/2003 | Han et al. |
| 6,653,247 B2 | 11/2003 | MacNeil |
| 6,716,725 B1 | 4/2004 | Ishikawa |
| 6,720,247 B2 | 4/2004 | Kirkpatrick et al. |
| 6,723,631 B2 | 4/2004 | Noguchi et al. |
| 6,727,173 B2 | 4/2004 | Sandhu et al. |
| 6,790,778 B1 | 9/2004 | Cheng et al. |
| 6,794,311 B2 | 9/2004 | Huang et al. |
| 6,811,936 B2 | 11/2004 | Smith et al. |
| 6,849,561 B1 | 2/2005 | Goundar |
| 6,949,203 B2 | 9/2005 | Hsieh et al. |
| 2001/0003064 A1 | 6/2001 | Ohto |

OTHER PUBLICATIONS

Gaillard et al., Physical and Optical Properties of an Antireflective Layer based on SiON, pp. 2777-2780.*

Ogawa et al (SPIE vol. 2197, p. 722-732 ).*

"Attenuate" Merriam-Webster Online Dictionary. 2010, http://www.merriam-webster.com (Jan. 14, 2010).*

Withmall, R. et al., "Matrix Reactions of Methylsilanes and Oxygen Atoms", The Journal of Physical Chemistry, vol. 92, No. 3, 1998, pp. 594-602.

Weidman, T. et al., "New Photodefinable Glass Etch Masks for Entirely Dry Photolithography: Plasma Deposited Organosilicon Hydride Polymers", Appl. Phys. Lett., vol. 62, No. 4, Jan. 25, 1993, pp. 372-374.

Weidman, T. et al., "All Dry Lithography: Applications of Plasma Polymerized Methylsilane as a Single Layer Resist and Silicon Dioxide Precursor", J. Photopolym. Sci. Technol., vol. 8, No. 4, 1995, pp. 679-686.

Joubert, O. et al., "Application of Plasma Polymerized Methylsilane in an All Dry Resist Process for 193 and 248nm Lithography", Microelectronic Engineering 30 (1996), pp. 275-278.

Joshi, A. et al., "Plasma Deposited Organosilicon Hydride Network Polymers as Versatile Resists for Entirely Dry Mid-Deep UV Photolithography", SPIE vol. 1925 (1993), pp. 709-720.

Matsuura, M. et al., A Highly Reliable Self-Planarizing Low-k Intermetal Dielectric for Sub-quarter Micron Interconnects, IEEE IEDM Tech. Dig., 1997, pp. 785-788.

Horie, O. et al., "Kinetics and Mechanism of the Reactions of O($^3$P) with $SiH_4$, $CH_3SiH_3$, $(CH_3)_2SiH_2$, and $(CH_3)_3SiH$", J. Phys. Chem. 1991, vol. 95, pp. 4393-4400.

McClatchie, S. et al., "Low Dielectric Constant Flowfill* Technology for IMD Applications", Proceed. of 3d Internatl. Dielectrics for ULSI Multilevel Interconnection Conf, Santa Clara, CA, Feb. 1997, pp. 34-40.

Beekman , K. et al., "Sub-Micron Gap Fill and In-Situ Planarisation Using Flowfill™ Technology", ULSI Conf, Portland, OR, Oct. 1995, pp. 1-7.

Text: Ralls, K. et al., "Introduction to Materials Science and Engineering", 1976 John Wiley & Sons, Inc., pp. 312-313.

Abstract: Loboda, M. et al., "Using Trimethylsilane to Improve Safety, Throughput and Versatility in PECVD Processes", Electrochemical Society Meeting Abstract No. 358, 191st Meeting, Montreal, Quebec, vol. MA 97-1, 1997, p. 454.

Anonymous, "New Gas Helps Make Faster ICs", Machine Design, vol. 71, Iss 21, Nov. 4, 1999. p. 118.

Grant. J., "Hackh's Chemical Dictionary", McGraw-Hill, Inc. 1969, Fourth Edition. p. 27.

Wolf Ph.D., Stanley, "Silicon Processing for the VLSI Era—vol. 3: The Submicron MOSFET," © 1995, p. 635.

Wolf Ph.D., Stanley, "Silicon Processing for the VLSI Era—vol. 2: Process Integration," © 1990, pp. 48, 49 and 435.

Kiermasz, A. et al., "Planarisation for Sub-Micron Devices Utilising a New Chemistry", DUMIC Conf., California, Feb. 1995, pp. 1-2.

Wolf, et al, "Silicon Processing . . . ", vol. 1, pp. 1 and 2.

U.S. Appl. No. 09/234,233, filed Jan. 20, 1999, Li et al.

Defranoux et al., *Deep ultra-violet measurements of SiON anti-reflective coatings by spectroscopic ellipsometry*, Elsevier, Thin-Solid Films (1998) pp. 742-744.

Merriam Webster Online Dictionary, Definition of partially, 2 pgs.

Merriam Webster Online Dictionary, Definition of partially, 2 pgs, Acquired Jun. 22, 2007.

* cited by examiner

SEMICONDUCTOR CONSTRUCTIONS HAVING ANTIREFLECTIVE PORTIONS

CROSS REFERENCE TO RELATED APPLICATION

This patent application is a Divisional Application of U.S. patent application Ser. No. 11/220,458, filed Sep. 6, 2005 now abandoned, which is a Continuation Application of U.S. patent application Ser. No. 10/917,820, filed Aug. 13, 2004 now abandoned, which is a Divisional Application of U.S. patent application Ser. No. 10/277,437, filed Oct. 21, 2002 now abandoned, which is a Divisional Application of U.S. patent application Ser. No. 09/885,393, filed Jun. 19, 2001, now U.S. Pat. No. 6,878,507 B2, issued Apr. 12, 2005, which is a Continuation Application of U.S. patent application Ser. No. 09/030,618 filed Feb. 25, 1998, now U.S. Pat. No. 6,274,292, issued Aug. 14, 2001; the disclosures of which are hereby incorporated by reference.

TECHNICAL FIELD

The invention pertains to semiconductor processing methods, such as, for example, methods of patterning photoresist in which an antireflective material is utilized to attenuate (for example, absorb) radiation.

BACKGROUND OF THE INVENTION

Semiconductor processing frequently involves providing a photoresist layer over a substrate. Portions of the photoresist layer are subsequently exposed to light through a masked light source. The mask contains clear and opaque features defining a pattern to be created in the photoresist layer. Regions of the photoresist layer which are exposed to light are made either soluble or insoluble in a solvent. If the exposed regions are soluble, a positive image of the mask is produced in the photoresist. The photoresist is therefore termed a positive photoresist. On the other hand, if the non-irradiated regions are dissolved by the solvent, a negative image results. Hence, the photoresist is referred to as a negative photoresist.

A difficulty that can occur when exposing photoresist to radiation is that waves of radiation can propagate through the photoresist to a layer beneath the photoresist and then be reflected back up through the photoresist to interact with other waves propagating through the photoresist. The reflected waves can constructively and/or destructively interfere with other waves propagating through the photoresist to create periodic variations of light intensity within the photoresist. Such variations of light intensity can cause the photoresist to receive non-uniform doses of energy throughout its thickness. The non-uniform dose can decrease the accuracy and precision with which a masked pattern is transferred to the photoresist. Also, the radiated waves reflected back from a non-flat surface underlying photoresist can enter portions of the photoresist that are not supposed to be exposed. Accordingly, it is desired to develop methods which suppress radiation waves from being reflected by layers beneath a photoresist layer.

A method which has been used with some success to suppress reflected waves is to form an antireflective material beneath a photoresist layer. Antireflective materials can, for example, comprise materials which absorb radiation, and which therefore quench reflection of the radiation.

Antireflective materials absorb various wavelengths of radiation with varying effectiveness. The wavelengths absorbed, and the effectiveness with which they are absorbed, vary depending on the materials utilized. The number of materials available for use as antireflective materials is limited. Accordingly, it is desired to develop alternative methods of varying the wavelengths absorbed, and effectiveness with which the wavelengths are absorbed, for antireflective materials.

SUMMARY OF THE INVENTION

In one aspect, the invention includes a semiconductor processing method wherein an antireflective material layer is formed over a substrate. At least a portion of the antireflective material layer is annealed at a temperature of greater than about 400° C. A layer of photoresist is formed over the annealed antireflective material layer. The layer of photoresist is patterned. A portion of the antireflective material layer unmasked by the patterned layer of photoresist is removed.

In another aspect, the invention includes a semiconductor processing method wherein an antireflective material layer is formed over a substrate. The antireflective material layer is annealed at a temperature of greater than about 400° C. A layer of photoresist is formed over the annealed antireflective material layer. Portions of the layer of photoresist are exposed to radiation waves, some of the radiation waves are attenuated by the antireflective material as the portions are exposed.

In yet another aspect, the invention includes a semiconductor processing method wherein a solid antireflective material layer is formed over a substrate. Optical properties of the antireflective material layer are altered. After altering the optical properties, a layer of photoresist is formed over the antireflective material layer. Portions of the layer of photoresist are exposed to radiation waves. Some of the radiation waves are absorbed by the antireflective material.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
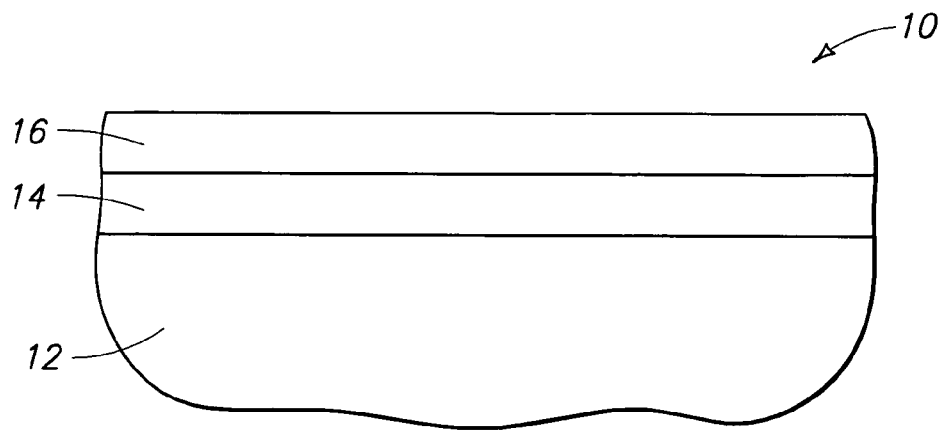
FIG. 1 is a fragmentary, diagrammatic, cross-sectional view of a semiductor wafer fragment at a preliminary processing step of a method of the present invention.

A method of the present invention is described with reference to FIGS. 1-3. Referring to FIG. 1, a semiconductor wafer fragment 10 is illustrated at a preliminary processing step. Wafer fragment 10 comprises a substrate 12, an overlying antireflective material layer 14, and a photoresist layer 16 over the antireflective material layer 14. The substrate can comprise, for example, a monocrystalline silicon wafer lightly doped with a conductivity-enhancing dopant. To aid in interpretation of this disclosure and the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

The antireflective material layer 14 can comprise an inorganic material, such as, for example, a material comprising from about 5% to about 37% (by atomic concentration) oxygen, about 10% to about 35% (by atomic concentration) nitrogen, from about 50% to about 65% (by atomic-concentration) silicon, and hydrogen. A specific example inorganic material comprises about 10% (by atomic concentration) nitrogen, about 25% (by atomic concentration) oxygen and about 65% (by atomic concentration) silicon. Antireflective coating layer 14 can, for example, consist of a single substantially homogeneous layer of the above-described inorganic material.

Figure 4:
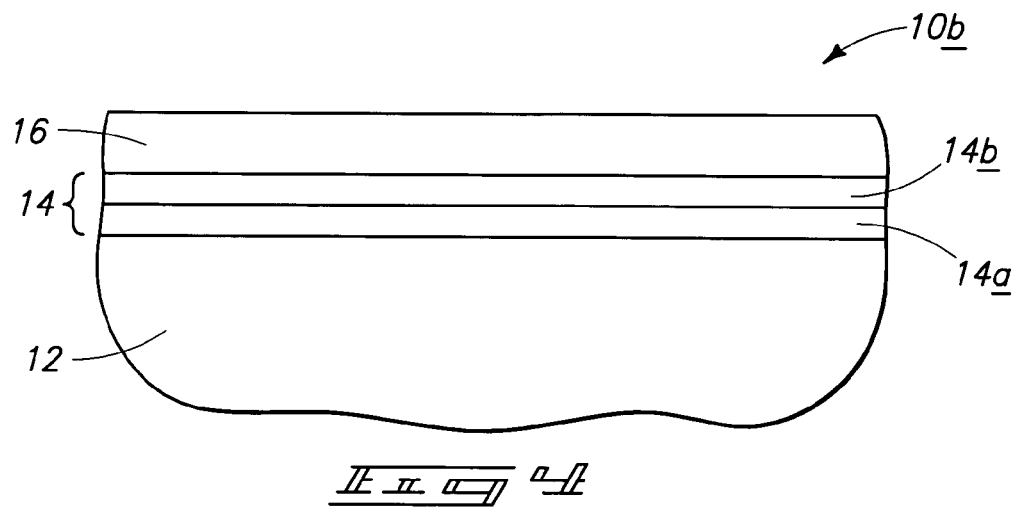
FIG. 4 is a second embodiment of a fragmentary, diagrammatic, cross-sectional view of a semiconductor wafer fragment at a preliminary processing step of a method of the present invention.
Figure 5:
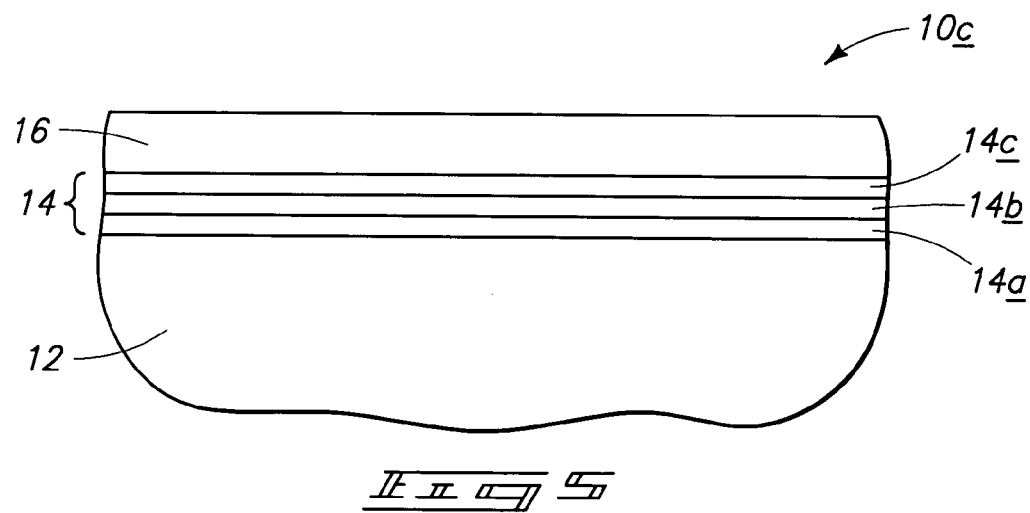
FIG. 5 is a third embodiment of a fragmentary, diagrammatic, cross-sectional view of a semiconductor wafer fragment at a preliminary processing step of a method of the present invention.

As another example, antireflective coating layer 14 can comprise a stack of materials, with at least one of the materials in the stack being configured to attenuate radiation that passes through the photoresist. The attenuation can encompass either total or partial absorption of such radiation. If the attenuation encompasses only partial absorption, then preferably the radiation that is not absorbed will be reflected at an appropriate wavelength and phase such that it is cancelled by other radiation passing through the stack. In exemplary configurations of an antireflective layer comprising a stack of materials, FIGS. 4 and 5 illustrate the layer 14 comprises a material 14a comprising from about 5% to about 37% (by atomic concentration) oxygen, about 10% to about 35% (by atomic concentration) nitrogen, from about 50% to about 65% (by atomic concentration) silicon, and hydrogen at the bottom of the stack. The remainder of the stack comprises one or more layers, 14b and 14c (FIG. 5) respectively, that are fully or partially transmissive of the radiation. Such layers (14b and 14c) can comprise, for example, silicon dioxide.

Photoresist layer 16 can comprise either a negative photoresist or a positive photoresist.

In accordance with the present invention, antireflective material layer 14 is applied over substrate 12 and at least a portion of layer 14 is annealed at a temperature greater than about 400° C. (preferably greater than 400° C.) prior to formation of photoresist layer 16. If the antireflective material includes a portion comprising the above-discussed inorganic materials comprising nitrogen, oxygen, hydrogen and silicon, such portion can be applied by chemical vapor deposition at a temperature of from about 250° C. to about 400°. The portion is then preferably annealed at a temperature of from about 800° C. to about 1050° C., more preferably from about 800° C. to about 900° C., and most preferably about 850° C. During the anneal, the antireflective material layer 14 is preferably exposed to a nitrogen-containing atmosphere, such as an atmosphere comprising $N_2$ and Ar. The atmosphere can, for example, consist essentially of $N_2$.

An anneal of an antireflective material layer at a temperature of greater than about 400° C. has been found to alter optical properties of the antireflective material layer to make the antireflective material layer more absorptive to radiation. Such anneal is particularly beneficial for a portion of an antireflective material layer comprising oxygen, nitrogen, silicon, and hydrogen. Specifically, the anneal has been found to influence a refractive index coefficient (n) of the antireflective material layer and an extinction coefficient (energy absorption coefficient) (k) of the antireflective material layer. For instance, it has been found that an anneal at greater than about 400° C. of a hydrogenated material comprising about 10% (by atomic concentration) nitrogen, about 25% (by atomic concentration) oxygen and about 65% (by atomic concentration) silicon will alter the "n" and "k" of the material exposed to 248 nanometer wavelength light from 2.12 and 1.19, respectively, to 1.89 and 1.41, respectively. Also, the anneal will alter the "n" and "k" of such material when exposed to 365 nanometer wavelength light from 2.67 and 0.59, respectively, to 2.89 and 1.11, respectively.

After the anneal of at least a portion of antireflective material layer 14, photoresist layer 16 is formed over antireflective layer 14. Photoresist layer 16 can be formed by conventional methods. An example method includes spinning a photoresist liquid over layer 14 and subsequently volatilizing solids from the layer to form a solid photoresist layer 16.

Figure 2:
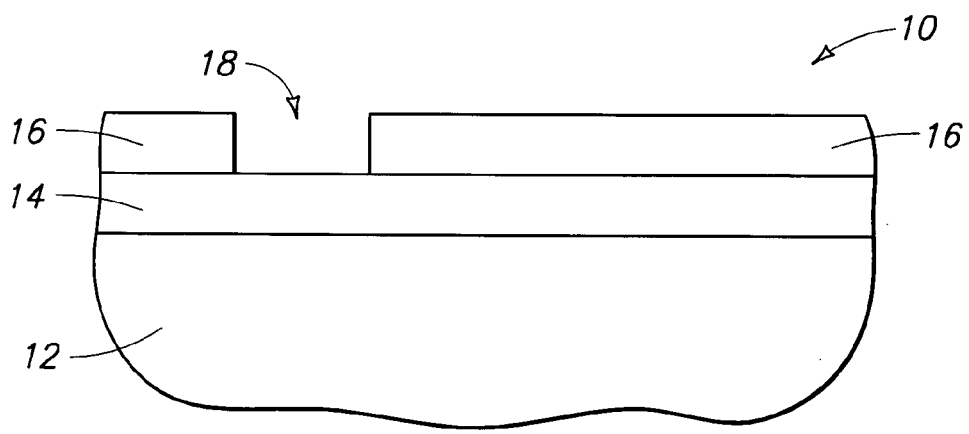
FIG. 2 is a view of the FIG. 1 wafer fragment at a processing step subsequent to that shown in FIG. 1.

Referring to FIG. 2, photoresist layer 16 is patterned by exposing the layer to a patterned beam of radiation. Such patterning can comprise conventional methods such as the negative photoresist processing or positive photoresist processing described in the "Background" section of this disclosure. Portions of photoresist layer 16 that are exposed to the radiation will behave differently in a solvent than will portions unexposed to radiation. Either the portion exposed to radiation or the portion unexposed to radiation is removed from over substrate 12 to leave the other of the portions exposed to radiation or unexposed to radiation remaining over substrate 12. Whether it is the portion that is exposed to radiation that is removed or the portion that is unexposed to radiation that is removed will depend on whether photoresist layer 16 comprises a negative or positive photoresist. The removal of a portion of photoresist layer 16 forms an opening 18 through photoresist layer 16. After formation of opening 18, photoresist layer 16 becomes a patterned mask. A portion of antireflective material layer 14 is covered by the patterned mask 16, and a portion is exposed through opening 18.

During the exposure of photoresist layer 16 to radiation, some of the radiation penetrates through layer 16 and into antireflective material layer 14. Antireflective material layer 14 attenuates, and preferably absorbs such penetrating radiation waves.

Figure 3:
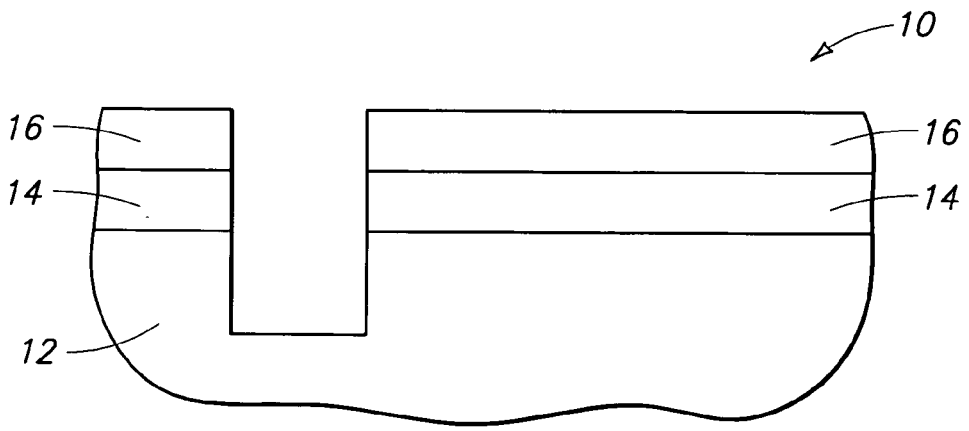
FIG. 3 is a view of the FIG. 1 wafer fragment at a processing step subseqent to that shown in FIG. 2.

Referring to FIG. 3, opening 18 is extended through antireflective material layer 14 and into substrate 12. Opening 18 can be extended by conventional methods, such as, for example, a dry plasma etch or a wet etch.

In the shown embodiment, photoresist layer 16 is against antireflective material layer 14. It is to be understood that in other embodiments of the invention, which are not shown, intervening layers can be formed between photoresist layer 16 and antireflective material layer 14. If such intervening layers are at least partially transparent to the radiation utilized to pattern photoresist layer 16, the radiation will penetrate to antireflective material layer 14 and be absorbed by material layer 14 during exposure of photoresist layer 16 to the radiation. It is also to be understood that if such intervening layers are present, a pattern of layer 16 could be transferred to the intervening layers without extending the pattern to layer 14. Thus, the invention encompasses embodiments in which antireflective material layer 14 is not etched.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A semiconductor construction comprising a substrate having a stack of layers thereover, at least one layer of the stack both contacting the substrate and comprising hydrogenated antireflective material, and another layer of the stack comprising silicon dioxide, wherein a refractive index coefficient of at least a portion of the material when exposed to 365 nm wavelength light is at least 2.89.

2. The construction of claim 1 wherein the material comprises silicon, oxygen, and nitrogen.

3. The construction of claim 1 wherein the construction further comprises a photoresist layer over and contacting a surface portion of the stack.

4. The construction of claim 1 wherein an extinction coefficient of at least a portion of the material when exposed to 365 nm wavelength light is at least 1.11.

5. The construction of claim 1 wherein the material is at least 10% nitrogen.

6. The construction of claim 1 wherein the material is at least 5% oxygen.

7. The construction of claim 1 wherein the material is at least 10% nitrogen and at least 5% oxygen.

8. The construction of claim 1 wherein the material is configured to attenuate radiation.

9. The construction of claim 1 wherein the stack comprises at least three layers, the one layer being the layer physically contacting the substrate.

* * * * *